(12) United States Patent
Eagen

(10) Patent No.: US 8,957,715 B2
(45) Date of Patent: Feb. 17, 2015

(54) OUTPUT DRIVER HAVING IMPROVED ELECTROMAGNETIC COMPATIBILITY (EMC) AND ASSOCIATED METHODS

(71) Applicant: Jeff Eagen, Manchester, NH (US)

(72) Inventor: Jeff Eagen, Manchester, NH (US)

(73) Assignee: Allegro Microsystems, LLC, Worcester, MA (US)

(*) Notice: Subject to any disclaimer, the term of this patent is extended or adjusted under 35 U.S.C. 154(b) by 0 days.

(21) Appl. No.: 13/653,824

(22) Filed: Oct. 17, 2012

(65) Prior Publication Data

US 2014/0103964 A1 Apr. 17, 2014

(51) Int. Cl.
*H03K 5/12* (2006.01)

(52) U.S. Cl.
USPC .............. 327/170; 327/108; 327/112; 326/83

(58) Field of Classification Search
USPC ......... 327/108–112, 170, 172–176, 375–377, 327/276, 277, 281; 326/82, 83, 87, 27
See application file for complete search history.

(56) References Cited

U.S. PATENT DOCUMENTS

| | | | | |
|---|---|---|---|---|
| 5,859,552 A | * | 1/1999 | Do et al. | 327/170 |
| 5,949,254 A | * | 9/1999 | Keeth | 326/87 |
| 6,118,310 A | | 9/2000 | Esch, Jr. | |
| 6,300,806 B1 | * | 10/2001 | Theus et al. | 327/112 |
| 6,380,728 B1 | * | 4/2002 | Tareilus et al. | 324/117 H |
| 6,509,757 B1 | * | 1/2003 | Humphrey | 326/30 |
| 8,035,418 B2 | | 10/2011 | Oh et al. | |
| 2002/0093366 A1 | * | 7/2002 | Fotouhi | 327/108 |
| 2008/0272813 A1 | * | 11/2008 | Bouillet | 327/161 |

* cited by examiner

*Primary Examiner* — Lincoln Donovan
*Assistant Examiner* — Thomas Skibinski
(74) *Attorney, Agent, or Firm* — Daly, Crowley, Mofford & Durkee, LLP

(57) ABSTRACT

An integrated circuit includes an output driver circuit having a plurality of output driver devices connected in a parallel arrangement and an output driver controller that is capable of individually controlling the conducting states of the output driver devices. In at least one embodiment, the controller is capable of achieving any of a plurality of different fall times (and/or rise times) in an output signal by appropriately controlling the conducting states of the output devices if a change in the state of the output signal is desired, in some implementations, the controller is capable of achieving different waveshapes during rising and/or failing edges of an output signal.

39 Claims, 9 Drawing Sheets

OUTPUT DRIVER HAVING IMPROVED ELECTROMAGNETIC COMPATIBILITY (EMC) AND ASSOCIATED METHODS

FIELD

Subject matter disclosed herein relates generally to integrated circuits and, more particularly, to techniques and circuits for improving the electromagnetic compatibility (EMC) of driver circuitry within integrated circuits.

BACKGROUND

Experimentation has shown that a weakly driven output driver circuit can be susceptible to pulsed radar and other electromagnetic interference (EMI) noise sources. Transients from EMI sources can cause a weakly driven output driver to change state, resulting in false output pulses or no output at all. On the other hand, driving an output driver too strongly can cause a burst of current to occur during switching that can create a radiated emission problem. In this scenario, the strongly driven output driver can actually act as a source of EMI to other nearby electronic devices or itself.

One technique that has been used to reduce the possibility that an output driver will radiate in an undesired manner is to adjust the fall time of the output signal generated by the driver. However, the fall time is typically adjusted by reducing the drive level of the driver, which increases the susceptibility of the circuit to EMI. Techniques and circuits are needed that will allow an output driver to have a reduced likelihood of generating undesired emissions, while having enhanced immunity to EMI and other noise sources.

SUMMARY

In embodiments described herein, an output driver circuit is provided that has enhanced robustness to noise with a reduced likelihood of generating undesired emissions. The output driver circuit may include, for example, an array of individually controlled output devices that are connected in a parallel arrangement to provide an output signal. In one embodiment, output devices may be controlled in such a way that provides increased control over the fall time and/or rise time of output signals. For example, in one possible approach, the output devices may be switched one after another to form a programmably-shaped output waveform according to the needs of a corresponding application. In other embodiments, groups of devices may be switched together in a controlled manner to provide a desired output waveform.

The speed at which the driver devices are activated may allow for a modified fall time of the output voltage across the output driver array that, in some embodiments, can be selected to reduce or prevent radiated emissions as necessary for a particular application. Individual device control provides added flexibility such that an array of output drivers may have multiple output fall/rise time configurations that may be fully user-selectable. In some implementations, the array of output drivers may also be capable of achieving a number of different waveshapes during falling and rising edges. In one exemplary embodiment, each individually controlled driver device has the ability to achieve a maximum drive strength possible.

In accordance with one aspect of the concepts, systems, circuits, and techniques described herein, an integrated circuit comprises: (a) an output driver circuit to generate an output signal for the integrated circuit, the output driver circuit comprising multiple driver devices connected in parallel, each of the multiple driver devices having a gate terminal, a drain terminal, and a source terminal, wherein the drain terminals of the multiple driver devices are coupled to a first node and the source terminals of the multiple driver devices are coupled to a second node; and (b) a controller to provide individual control signals to gate terminals of the multiple driver devices to control a state of the output signal, the controller having a change state input to receive an indication to change the state of the output signal and one or more select inputs responsive to a code word indicating a manner in which the multiple driver devices are to change conducting state when the state of the output signal is being changed.

In accordance with another aspect of the concepts, systems, circuits, and techniques described herein, an integrated circuit comprises: (a) an output driver circuit to generate an output signal for the integrated circuit, the output driver circuit comprising multiple driver devices connected in parallel, each of the multiple driver devices having a gate terminal, a drain terminal, and a source terminal, wherein the drain terminals of the multiple driver devices are coupled to a first node and the source terminals of the multiple driver devices are coupled to a second node; and (b) a controller to provide individual control signals to gate terminals of the multiple driver devices to control a state of the output signal, the controller being configured to change conducting states of the multiple driver devices in a sequential manner if a change in the state of the output signal is desired.

In accordance with a further aspect of the concepts, systems, circuits, and techniques described herein, an integrated circuit comprises: (a) an output driver circuit to generate an output signal for the integrated circuit, the output driver circuit comprising multiple driver devices connected in parallel, each of the multiple driver devices having a gate terminal, a drain terminal, and a source terminal, the drain terminals of the multiple driver devices being coupled to a first node and the source terminals of the multiple driver devices being coupled to a second node, wherein the multiple driver devices include at least one smaller driver device and at least one larger driver device; and (b) a controller to provide individual control signals to gate terminals of each of the multiple driver devices to control a state of the output signal, wherein the controller is configured to first change the conducting state of the at least one smaller driver device and then change the conducting state of the at least one larger driver device to change the state of the output signal.

In accordance with a still further aspect of the concepts, systems, circuits, and techniques described herein, a method for operating an output driver circuit within an Integrated circuit that includes multiple output driver devices connected in parallel for use in generating an output signal comprises: (a) determining that a change is needed in a state of the output signal; (b) acquiring select information indicating a manner in which the multiple output driver devices are to change conducting state to achieve the change in state of the output signal; (c) receiving a clock signal; and (d) generating individual control signals for the multiple output driver devices based, at least in part, on the clock signal and the select information.

In accordance with still yet another aspect of the concepts, systems, circuits, and techniques described herein, a method for operating an output driver circuit having at least one smaller output driver device and at least one larger output driver device connected in parallel for use in generating an output signal comprises: (a) determining that a change is needed in a state of the output signal; (b) turning on the at least one smaller output driver device to change the state of the output signal to a new output state in response to determining;

and (c) turning on the at least one larger output driver device after turning on the at least one smaller output driver device.

BRIEF DESCRIPTION OF THE DRAWINGS

The foregoing features may be more fully understood from the following description of the drawings in which.

DETAILED DESCRIPTION

Figure 1:
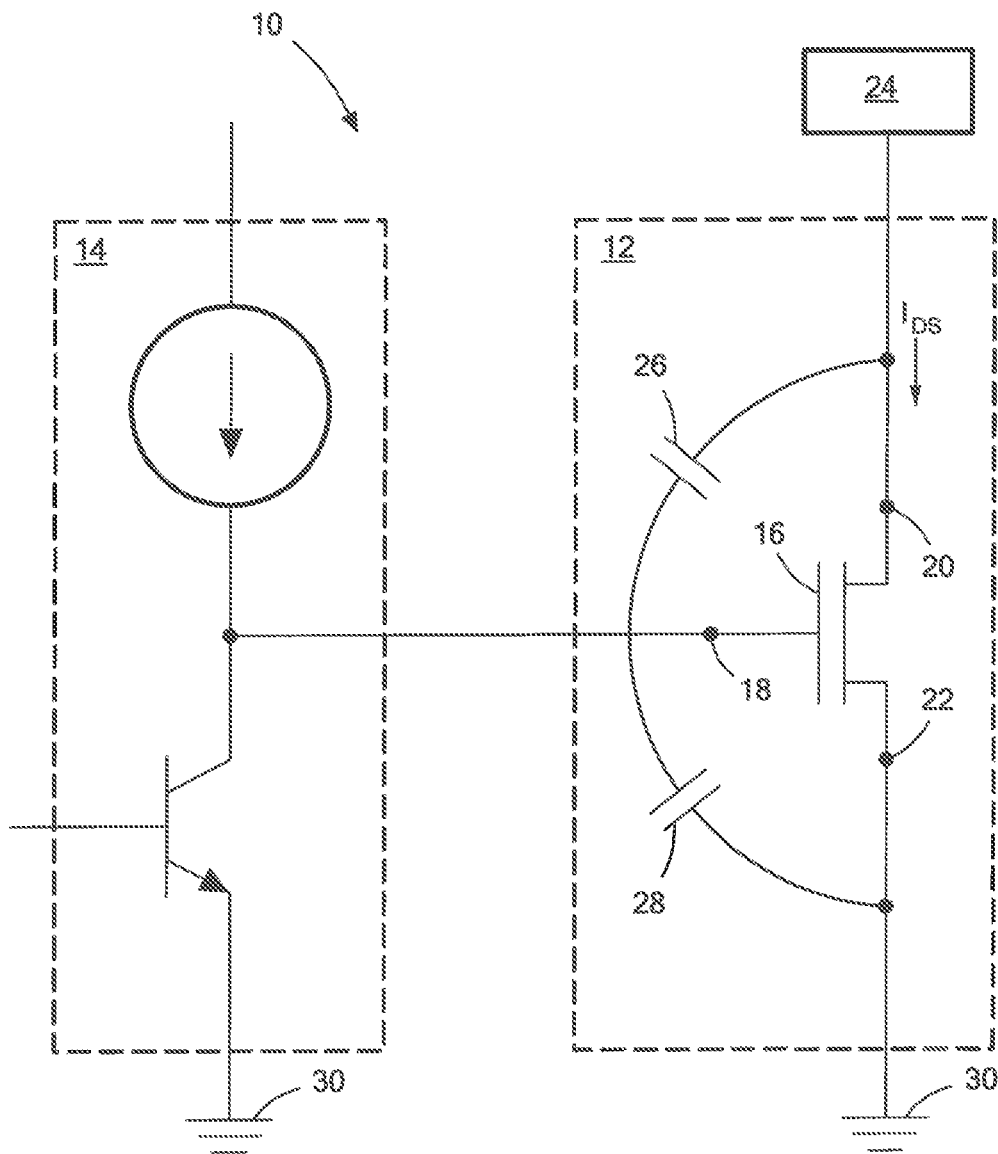
FIG. 1 is a schematic diagram illustrating a conventional output driver circuit.

FIG. 1 is a schematic diagram illustrating a conventional output driver circuit 10 that may be used to provide an output signal for an integrated circuit (IC). As illustrated, output driver circuit 10 may include an output driver device 12 and a gate control circuit 14. Output driver device 12 may include a transistor such as, for example, an insulated gate field effect transistor (IGFET) 16 that includes a gate terminal 18, a drain terminal 20, and a source terminal 22. As shown, drain terminal 20 of output driver device 12 may be connected to a contact pad 24 (or other type of lead, pin, or contact) of the integrated circuit. When the integrated circuit is placed in a system, contact pad 24 may be coupled to an external load device (e.g., a pull up load) to provide a signal to the load device. Source terminal 22 of output driver device 12 may be connected to an external ground 30 through another contact of the integrated circuit. During normal integrated circuit operation, gate control circuit 14 drives gate terminal 18 of output driver device 12 to generate either a logic zero or a logic one signal value on an output terminal 24.

With reference to FIG. 1, output driver device 12 may include a gate-to-drain parasitic capacitance ($C_{gd}$) 26 and a gate-to-source parasitic capacitance ($C_{gs}$) 28. As will be appreciated, these parasitic capacitances 26, 28 may provide a certain degree of coupling between gate terminal 18 and drain and source terminals 20, 22, respectively. In cases where output driver device 12 is being weakly driven by gate control circuit 14, electromagnetic interference (EMI) received at the integrated circuit (from, for example, a pulsed radar system or other EMI source) can couple through one or both of the parasitic capacitances 26, 28 and change the output state of device 12. This can create errors in the data delivered to the load device. If output driver device 12 is driven too strongly, on the other hand, bursts of current $I_{DS}$ can be created during switching activity that can form a source of EMI to circuitry both inside and outside the integrated circuit. Techniques and circuits are provided herein that are capable of addressing both of the above problems in an output driver circuit.

As used herein, a transistor may be considered "strongly driven" when a drive source has a low impedance with high current capability resulting in faster device turn on. Conversely, a transistor may be considered "weakly driven" when a drive source has a higher impedance with lower current capability, resulting in slower device turn on.

Figure 2A:
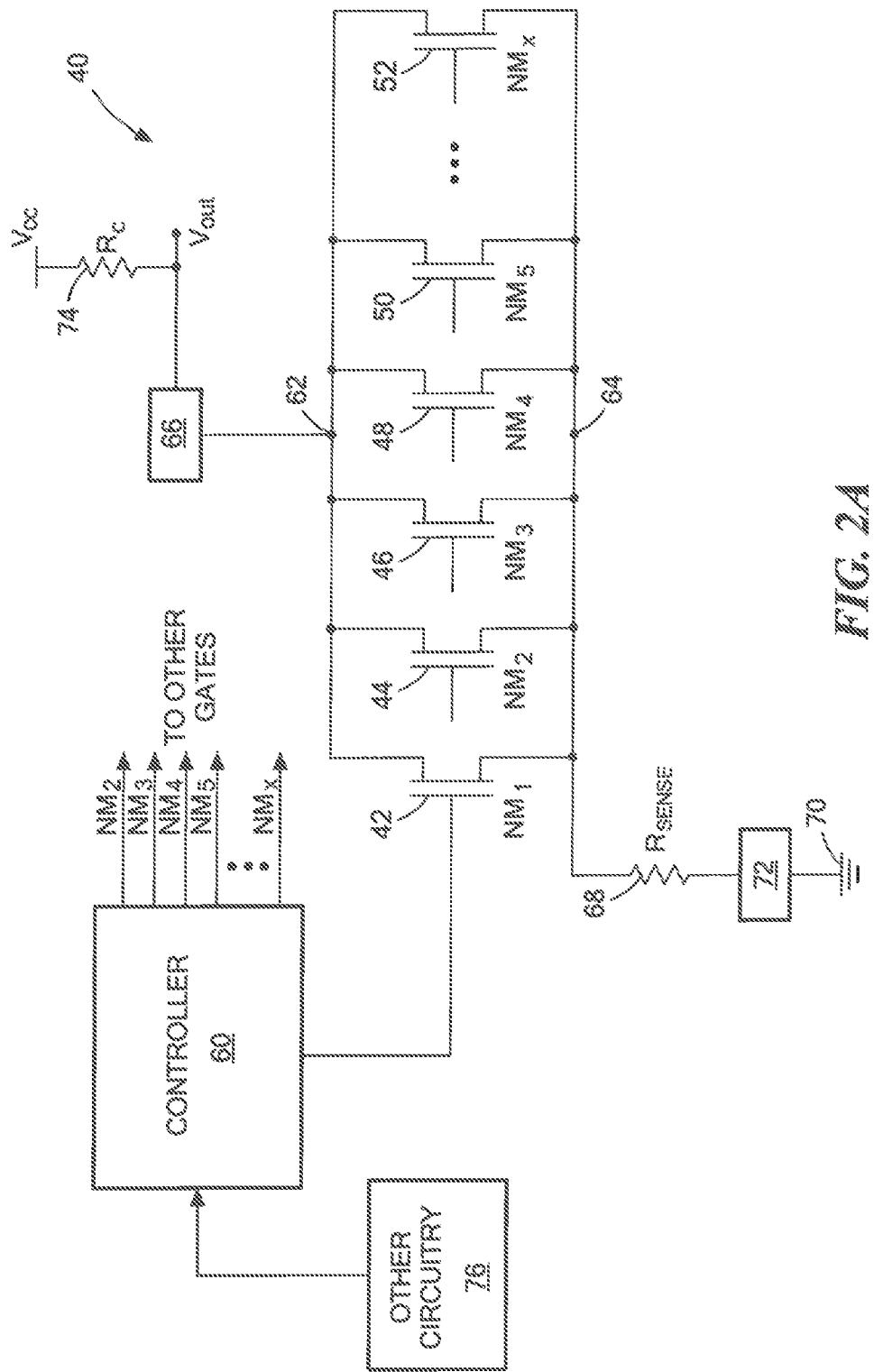
FIG. 2A is a schematic diagram illustrating an example output driver system in accordance with an embodiment.

FIG. 2A is a schematic diagram illustrating an example output driver system 40 in accordance with an embodiment. Output driver system 40 may be used to provide, for example, an output signal for an integrated circuit, hi some embodiments, the output signal may be a digital signal, although analog output drivers may also be implemented. As illustrated, output driver system 40 may include a number of output driver devices 42, 44, 46, 48, 50, 52 connected in a parallel arrangement. Output driver system 40 may also include an output driver controller 60 to generate control signals for the output driver devices 42, 44, 46, 48, 50, 52 during driver operation. Each driver device 42, 44, 46, 48, 50, 52 may be independently controlled by output driver controller 60. As shown, controller 60 may have other circuitry 76 coupled to an input thereof to provide data or other signals to controller 60 for output by output driver system 40. In some implementations, other circuitry 76 may provide an indication to controller 60 that the output state of the output signal needs to change. Other circuitry 76 may include any of a wide variety of different circuit types.

As will be described in greater detail, the architecture of output driver system 40 is significantly less susceptible to problems relating to EMI and other noise in an environment surrounding the integrated circuit. In addition, output driver system 40 is much less likely to be a source of EMI during driver switching activity. In some implementations, output driver system 40 may be capable of controllably adjusting fall times and/or rise times of output signals. In this manner, greater control can be achieved over fall times and EMI generation within the driver.

In the illustrated embodiment, output driver devices 42, 44, 46, 48, 50, 52 are n-channel IGFETs, each having a gate terminal, a drain terminal, and a source terminal. Other types of transistors may be used in other implementations (including, e.g., other types of FETs, bipolar junction transistors, etc.). As shown in FIG. 2A, output driver controller 60 may be separately coupled to the gate terminals of each of the output driver devices 42, 44, 46, 48, 50, 52 to provide an individual control signal to each device. Although illustrated with six output driver devices, it should be appreciated that any number of devices may be used (i.e., two or more) in a particular implementation. The total number of devices may be selected so that the correct saturation requirements are achieved for the output driver when the devices are in the state.

As illustrated in FIG. 2A, the drain terminals of output driver devices 42, 44, 46, 48, 50, 52 are each coupled to a first node 62 and the source terminals of the output driver devices 42, 44, 46, 48, 50, 52 are each coupled to a second node 64. In some implementations, first node 62 may be coupled to, for example, a pad 66 and second node 64 may be coupled to a pad 72. Pads 66, 72 may represent, for example, contacts on a semiconductor the or contacts, leads, or terminals on a corresponding integrated circuit package. Any type of integrated circuit package may be used including, for example, dual in-line packages (DIP), pin grid arrays (PGA), leadless chip carrier (LCC) packages, surface mount packages, quad-flat-pack (QFP) packages, thin small outline packages (TSOP), and grid arrays (LGA), ball grid arrays (BGA), flip chip packages, multi-chip packages, system-in-package (SIP) packages, multi-chip modules (MCM), and/or others. When output driver system 40 is placed in a system, pad 66 may be coupled to an external load device (e.g., pull up load resistor 74 in FIG. 2A) to deliver an output signal to the load device. Likewise, pad 72 may be coupled to an external ground 70 when output driver system 40 is placed in a system.

In some embodiments, a sense resistor 68 or other sensor may be placed between node 64 and contact pad 72 for use in sensing an over-current condition (e.g., a short circuit current level ($I_{SC}$), etc.) In output driver system 40. If an over-current condition is detected, all devices within driver system 40 can be controlled to shut down simultaneously (i.e., change to a non-conducting state, etc.).

In at least one embodiment, output driver devices 42, 44, 46, 48, 50, 52 may be switched on (or off) in a sequential fashion by output driver controller 60 to create a waveshape type of response in an output signal. In addition, in some embodiments, the speed at which the output driver devices 42, 44, 46, 48, 50, 52 are switched on (or off) may be controllable. In this manner, the fall time (and/or rise time) of the output signal can be controlled.

Because multiple output devices are being used in output driver system 40, smaller devices may be employed. As is well known, smaller output devices typically have lower parasitic capacitances. As was described above, when an output device is under-driven, EMI and other noise can couple through parasitic capacitances and potentially change the state of an output signal. Therefore, the smaller coupling capacitances associated with the output devices in system 40 can reduce the likelihood that transients will change the output state of the driver. In addition, because multiple driver devices are being used and different devices are switched at different times, the individual devices may be driven harder than a single device can be driven without creating unwanted EMI emissions. Furthermore, when the devices are switched "on" one-by-one in a sequential fashion (or in groups as described below), at any particular time during the switching process, some of the devices may be strongly on, some of the devices may be strongly off, and only one (or a few) of the devices may be susceptible to coupling due to a transient (i.e., the device(s) currently transitioning between states).

Figure 2B:
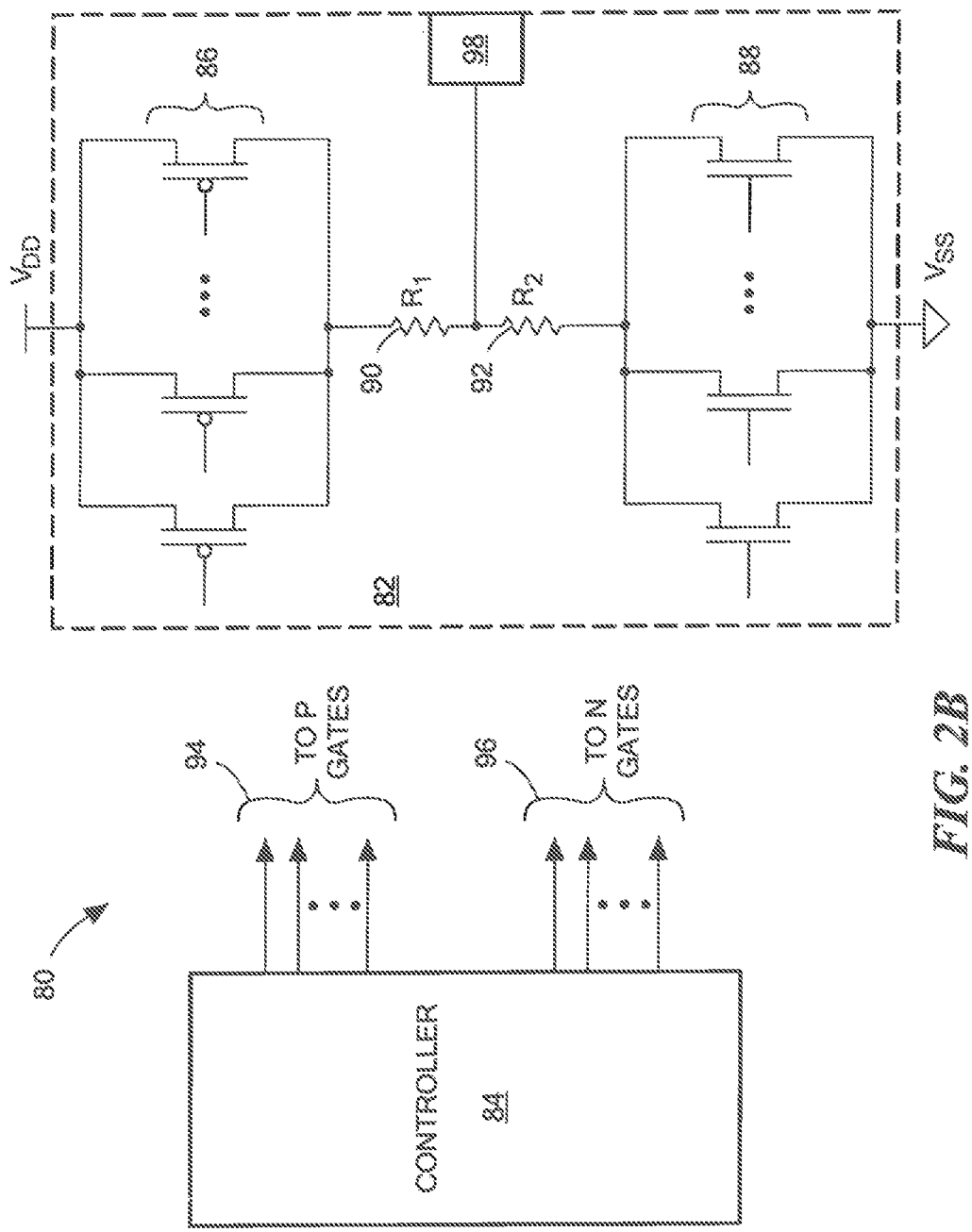
FIG. 2B is a schematic diagram illustrating an example output driver system having a push-pull configuration in accordance with an embodiment.

In the example output driver system 40 of FIG. 2A, a group of parallel connected n-channel driver devices are used. In an alternative arrangement, a push-pull output driver configuration may be used that includes a group of parallel connected p-channel devices and a group of parallel connected n-channel devices. FIG. 2B is a schematic diagram illustrating an example output driver system 80 that uses a push-pull configuration in accordance with an embodiment. As illustrated, output driver system 80 includes an output driver circuit 82 being driven by a controller 84, which can be a digital controller or an analog controller. Output driver circuit 82 includes a group of p-channel output driver devices 86 connected in parallel and a group of n-channel output driver devices 88 connected in parallel. The group of p-channel output driver devices 86 is connected to a first supply potential $V_{DD}$ and the group of n-channel output driver devices 88 is connected to a second supply potential $V_{SS}$. First and second resistors 90, 92 are coupled between the p-channel devices 86 and the n-channel devices 88. An output pad 98 may be coupled to a node between the two resistors 90, 92. Output pad 98 may represent, for example, a contact on a semiconductor die or a contact, lead, or terminal on a corresponding integrated circuit package. When output driver system 80 is implemented in a system, output pad 98 may be connected to an external load device.

Controller 84 is operative for providing control signals to the group of p-channel output driver devices 86 and the group of n-channel output driver devices 88 to generate an output signal for the integrated circuit. In at least one implementation, controller 84 may provide independent control for each device in the two groups 86, 88. That is, controller 84 may include first outputs 94 coupled to the individual gates of the p-channel devices and second outputs 96 coupled to the individual gates of the n-channel devices. Control of the individual devices may be similar to that described above. That is, devices may be switched all together, one at a time, and/or in predefined groups to achieve a variety of different fall time and/or rise time characteristics.

Figure 3A:
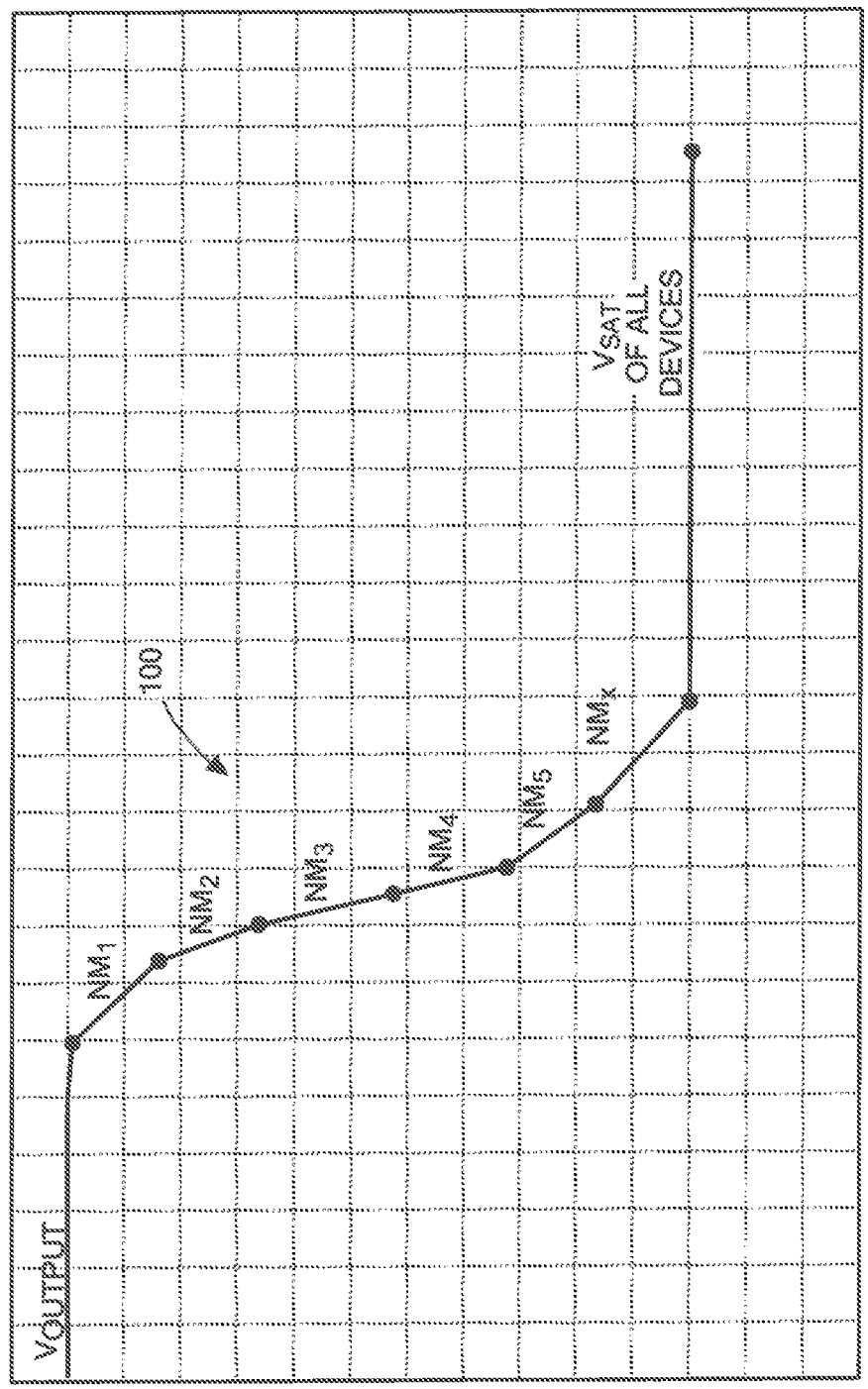
FIGS. 3A and 3B are waveform diagrams illustrating falling edges of output signals of output driver circuits in accordance with embodiments.
Figure 3B:
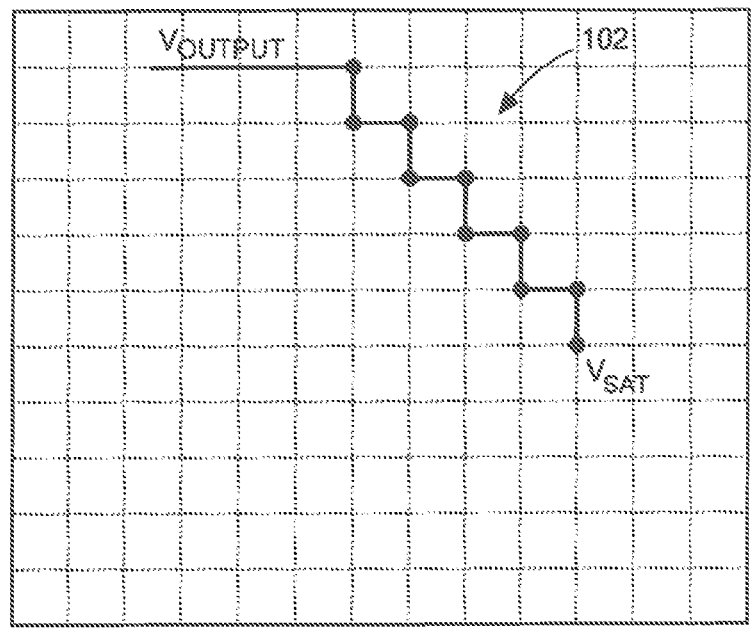
Figure 4:
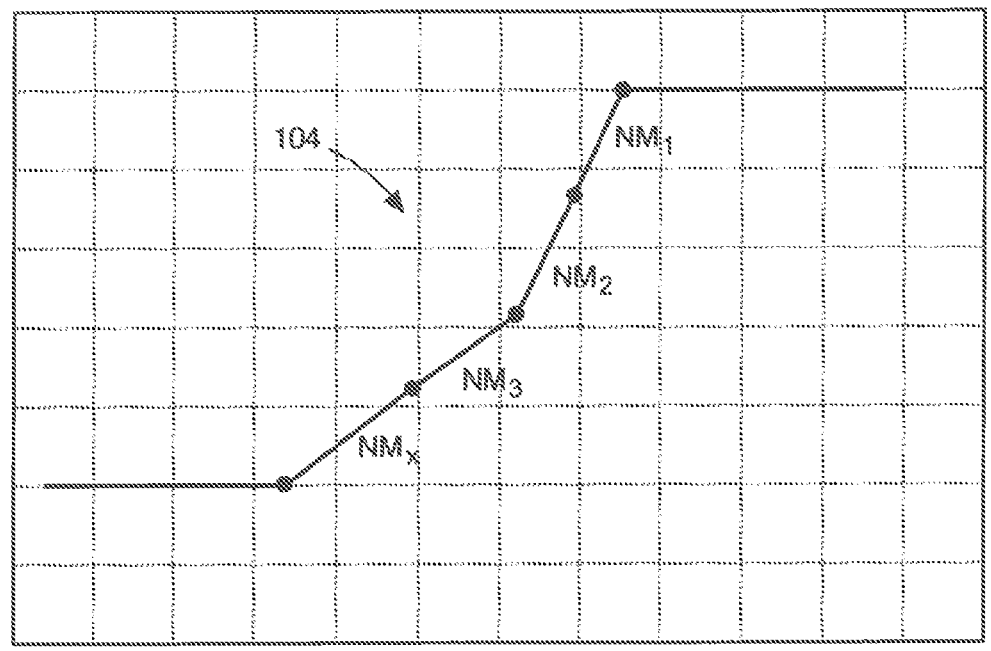
FIG. 4 is a waveform diagram illustrating a rising edge of an output signal of an output driver circuit in accordance with an embodiment.

FIGS. 3A and 3B are waveform diagrams illustrating example falling edges 100, 102 of output signals of output driver circuits in accordance with various implementations. As shown in FIG. 3A, as each output driver device ($NM_1$, $NM_2$, $NM_3$, ..., $NM_x$) of an output driver circuit is switched on, the output voltage of the output driver will decrease incrementally until all of the devices are in saturation. When a slower device to device switching interval is used, the fall time of the output signal may appear to be more of a stair step function, as shown in FIG. 3B. To achieve a fastest fall time, all of the output driver devices may be switched on at the same time. In some implementations, the speed at which the devices are activated can be controlled to reduce or prevent EMI radiated emissions, in this manner, an end user may be able to select a fastest fall time that does not create harmful EMI for a particular circuit application. As shown in FIG. 4, in some implementations, a rising edge 104 of an output signal may also be digitally controllable. This may depend upon, for example, whether or not there is a capacitor (or multiple capacitors) across the output and, if there is, the value of the capacitor(s). In other implementations, only fall time is shaped.

Figure 5:
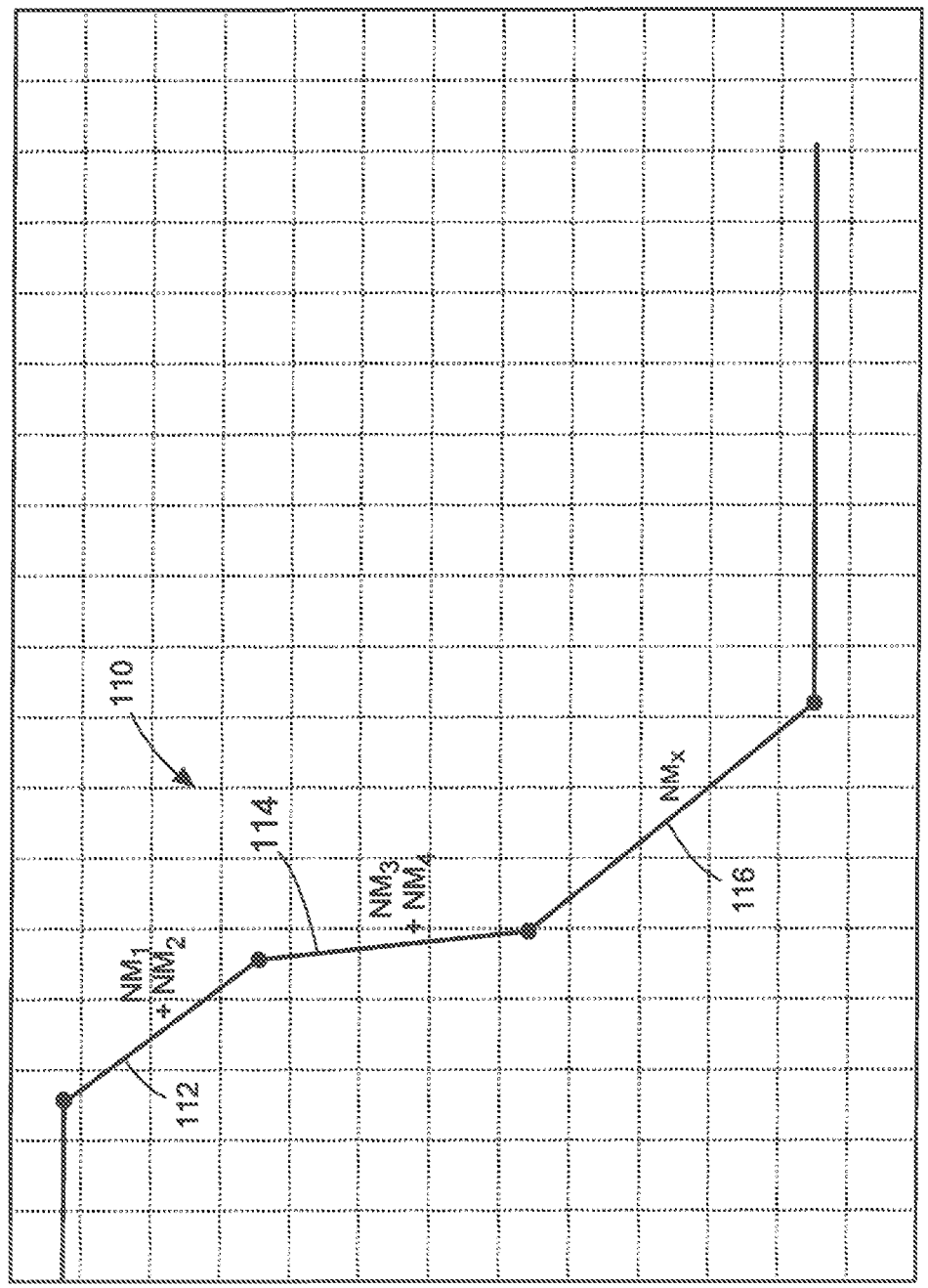
FIG. 5 is a waveform diagram illustrating a falling edge of an output signal of an output driver circuit that allows simultaneous switching of groups of devices in accordance with an embodiment.

In some embodiments, groups of output driver devices may be controlled simultaneously, to provide further flexibility in controlling the fall time (or rise time) of an output signal. FIG. 5 is a waveform diagram illustrating a falling edge 110 of an output signal of an output driver circuit that allows simultaneous switching of groups of devices in an implementation. As illustrated, for a first segment 112 of falling edge 110, output devices $NM_1$ and $NM_2$ are simultaneously activated; for a second segment 114, output devices $NM_3$ and $NM_4$ are simultaneously activated; and for a third segment 116, output device $NM_x$ is activated. As will be appreciated, the output driver devices within an output driver circuit may be divided into groups in any of a variety of different ways in different implementations. In this manner, a single output driver circuit may be capable of providing an end user with a variety of different output fail times and/or rise times.

Because the drains and sources of the individual output devices are tied together, the overall form factor of the output driver circuit behaves in substantially the same manner as conventional single-device output drivers with respect to electrostatic discharge (ESD) and short circuit detection. In addition, the additional perimeter area associated with having multiple output devices in parallel can result in improvements in reverse ESD due to decreased resistance associated with increased well contact area.

In some implementations, all of the output driver devices in the output driver circuit (e.g., output driver devices 42, 44, 46, 48, 50, 52 in FIG. 2A) may be substantially the same or similar in size. In other implementations, however, different sized devices may be used. For example, in some implementations, two (or more) different sized output transistors are used in which one or more smaller output driver devices are used in combination with a larger device. When multiple smaller devices are used, the smaller output devices may all be substantially the same size, or different sized smaller devices may be used. As used herein, the "size" of a driver device refers to its physical dimensions (e.g., length and width), which will typically dictate the device's current handling capacity and "on" resistance.

Figure 6:
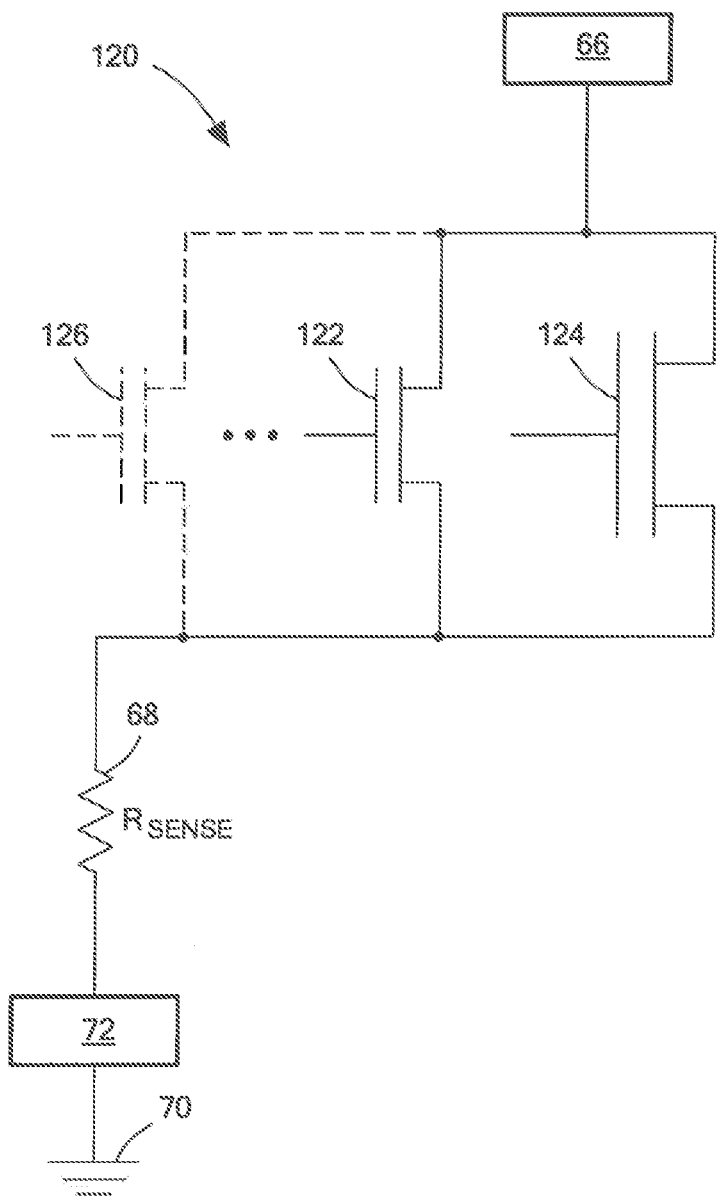
FIG. 6 is a schematic diagram illustrating an example output driver circuit using different sized output devices in accordance with an embodiment.

FIG. 6 is a schematic diagram illustrating an example output driver circuit 120 using different sized output transistors in accordance with an embodiment. As illustrated, output driver circuit 120 includes a smaller output driver device 122 coupled in parallel with a larger device 124. During operation, when a change in output state is desired, a controller (not shown) may first drive smaller device 122 in a weak fashion to increase the fall time of the output signal to prevent the generation of EMI. After the smaller device 122 has reached saturation, the larger device 124 may be strongly driven "on" to quickly "lock in" the output state of the driver circuit so that it is less susceptible to transients. Because smaller device 122 is already in saturation, the quick activation of parking brake device 124 will typically generate little or no EMI. This approach will be referred to herein as the parking brake approach.

In other parking brake embodiments, one or more additional smaller devices 126 may be used with the larger device 124. When multiple smaller devices are used, the smaller devices may all be turned on at the same time using a reduced drive level (i.e., weakly driven) until $V_{SAT}$ is reached, as described above for the embodiment using a single smaller device. Alternatively, the smaller devices may each be turned on one at a time (or in groups) until $V_{SAT}$ is reached. At this point, the larger device 124 may be switched on to lock the output driver circuit into the desired state. Using this approach, the multiple smaller devices may each be driven more strongly than in the embodiment using a single smaller device. This is because the increased fall time to prevent EMI emissions can be achieved by appropriately timing the activation of the smaller devices. In at least one implementation, multiple larger devices may be used. Although effective, the parking brake approach can involve higher area cost than other multi-device driver implementations described herein due to the need to maintain correct $V_{SAT}$ ratings.

Figure 7:
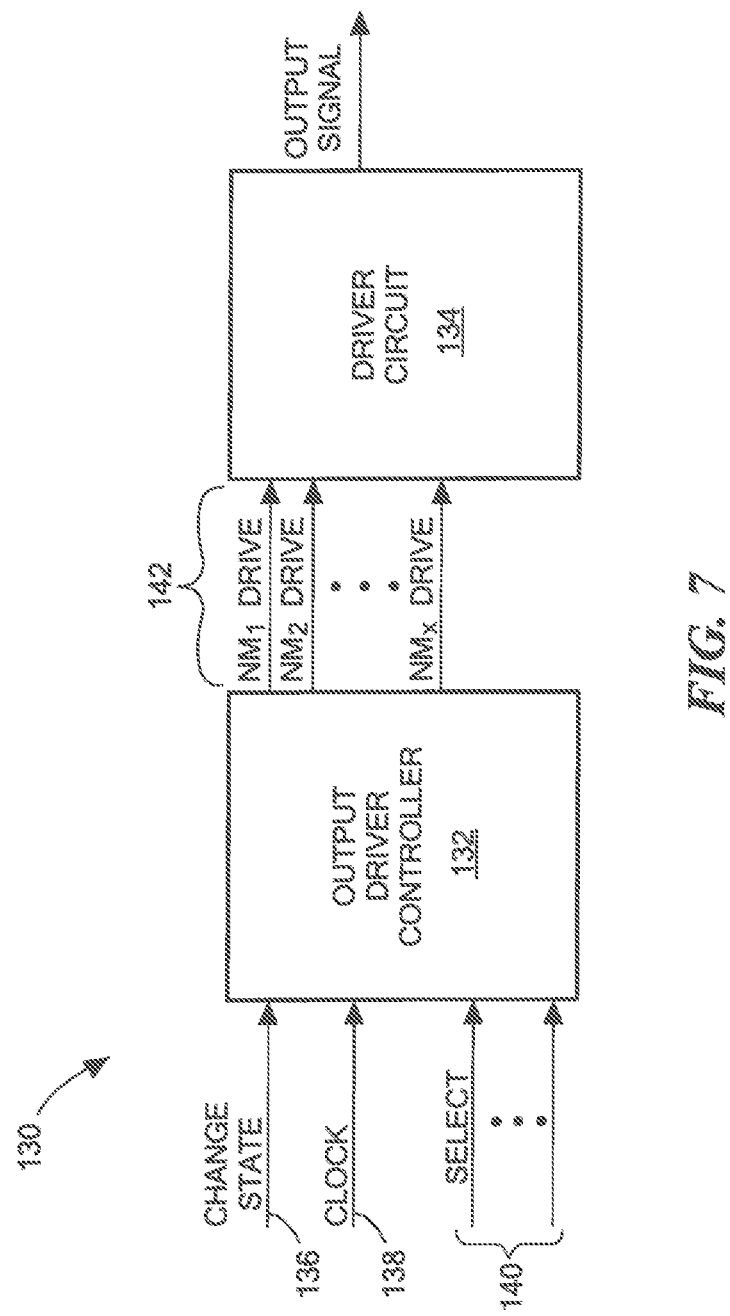
FIG. 7 is a block diagram illustrating an example output driver system that may be used within an integrated circuit in accordance with an embodiment.

FIG. 7 is a block diagram illustrating an example output driver system 130 that may be used within an integrated circuit in accordance with an embodiment. As illustrated, output driver system 130 includes an output driver controller 132 and an output driver circuit 134. Output driver circuit 134 includes multiple output driver devices connected in parallel. Output driver controller 132 is a controller device that is capable of controlling the operation of output driver circuit 134 to achieve an output signal waveform having desired characteristics. As illustrated, output driver controller 132 may include a plurality of output ports 142 to provide individual control signals to the output driver devices of output driver circuit 134. Output driver controller 132 may also include multiple input ports for use in configuring controller 132 to achieve a desired driver output response.

In the embodiment illustrated in FIG. 7, output driver controller 132 includes a "change state" input port 136, a clock input port 138, and one or more select input ports 140. Change state input port 130 may be used to indicate to output driver controller 132 when the output state of the driver circuit is to change state. Clock input port 138 may be used to deliver a clock signal to output driver controller 132 for use as a timing reference for switching the various output devices. Although not shown, a clock source may be coupled to clock input 138 of output driver controller 132 to generate the clock signal. The select input(s) 140 may be used to adjust fall time and/or rise time characteristics of the output signal of driver circuit 134.

As will be described in greater detail, different techniques may be used to adjust the fall time and/or rise time characteristics of output driver system 130 in different implementations. For example, in one possible approach, a number of different device grouping schemes may be defined for system 130 that may each achieve a different fall time and/or rise time. The different device groupings may also provide different desired waveshapes during rise and fall times in some implementations. In another approach, adjustments may be made to a clock signal used to provide timing for switching operations in system 130 to achieve a desired fall time or rise time. Combinations of these two approaches may also be implemented.

In at least one implementation, a number of code words may be defined for output driver system 130 that each correspond to a different output device switching scheme to be used to switch the output devices in driver circuit 134 when a switch in output state is desired. Different switching schemes may result in a different output signal fall times (and/or rise times). A selected code word may be delivered to output driver controller 132 on, for example, select input(s) 140. Each code word may include one or more bits. Table 1 below illustrates an example coding scheme that may be used for an output driver circuit having nine output driver devices in accordance with an implementation. As shown in the table, each code word includes 4 binary bits (labeled Select 0, Select 1, Select 2, and Select 3).

When all of the select bits are logic zero, all 9 of the output driver devices may be switched simultaneously in the output driver circuit 134. This setting results in the sharpest possible slew rate in the output signal. When the Select 0 bit is logic one and the other bits are logic zero, the output driver devices may be switched on (or off) one at a time in a sequential fashion at the input clock rate (i.e., one device per clock interval). This mode of operation will result in the slowest output slew rate. When the Select 1 bit is logic one and the other select bits are logic zero, the output devices may be activated in four device groups in a sequential fashion at the input clock rate (i.e., one device group per clock interval). As shown in the table, a first device group may include devices 1 and 2; a second device group may include

TABLE 1

| SELECT 0 | SELECT 1 | SELECT 2 | SELECT 3 | GROUPING SCHEME |
|---|---|---|---|---|
| 0 | 0 | 0 | 0 | SWITCH ALL DEVICES SIMULTANEOUSLY |
| 1 | 0 | 0 | 0 | SWITCH INDIVIDUAL DEVICES SEQUENTIALLY |
| 0 | 1 | 0 | 0 | DEVICE GROUPS DEVICES 1, 2 |

TABLE 1-continued

| SELECT 0 | SELECT 1 | SELECT 2 | SELECT 3 | GROUPING SCHEME |
|---|---|---|---|---|
|  |  |  |  | DEVICES 3, 4<br>DEVICES 5, 6<br>DEVICES 7, 8, 9 |
| 0 | 0 | 1 | 0 | DEVICE GROUPS<br>DEVICES 1, 2, 3<br>DEVICES 4, 5, 6<br>DEVICES 7, 8, 9 |
| 0 | 0 | 0 | 1 | DEVICE GROUPS<br>DEVICES 1, 2, 3, 4<br>DEVICE 5<br>DEVICES 6, 7, 8, 9 | devices 3 and 4; a third device group may include devices 5 and 6; and a fourth device group may include devices 7, 8, and 9. When the Select 2 bit is logic one and the other bits are logic zero, the output devices may be activated in three device groups: a first group including devices 1, 2, and 3; a second device group including devices 4, 5, and 6; and a third device group including devices 7, 8, and 9. Because there are fewer device groups, the fall time of the output signal will be shorter than the previous scheme.

When the Select 3 bit is logic one and the other select bits are logic zero, the output devices will again be activated in three device groups: a first group including devices 1, 2, 3, and 4; a second device group including device 5; and a third device group including devices 6, 7, 8, and 9. Because the number of device groups are the same as the previous example, the resulting fall time will be the same or similar, but the shape of the waveform during this fall time may be different. In general, the number of devices in each group may affect the slew rate of the output signal during a corresponding segment of the fall time. Thus, assuming equal size devices, a group having four devices may result in a higher slew rate than a group having a single device. Therefore, by defining different device groups, different slew rates may be achieved during different segments of a failing or rising edge of an output signal. In this manner, an end user may be able to select a waveshape as well as a fail time (and/or rise time) that works best for a given application. As will be appreciated, the coding and device grouping scheme of Table 1 is only an example of one possible scheme that may be used in a particular implementation. Many alternative schemes may be used in other implementations.

In some embodiments, fall time and/or rise time may be adjusted by varying a frequency of a clock signal used to generate the output signal, rather than turning the devices on and off according to predefined groups. For example, in one approach, a number of code words may be defined for input on select line(s) 140 of output driver controller 132 that correspond to different factors that may be used to divide down an input clock signal. When output driver controller 132 receives a command to change output state, it may activate the output devices of driver circuit 134 in sequence at the divided down clock rate. One of the code words may indicate that all of the output devices are to be turned on (or off) simultaneously. Another code word may indicate that the unmodified input clock signal on clock line 138 is to be used to switch the output devices. The other code words may each correspond to a different clock division factor. For example, one code word may indicate that a factor of two is to be used. In this case, a clock signal having half the frequency of the input clock signal will be used to switch the output devices. The highest factor will generate the slowest fall time (or rise time) in the output signal. The number of bits that are used for the code words may depend upon, for example, the number of different fall and/or rise times that are to be provided in a particular system.

In some implementations, a combination of the two techniques described above may be used to set the rise and/or fall time of the output signal of output driver system 130. For example, in one possible approach, code words may be defined that set a clock frequency for use in switching and that also specify different groups of devices that may be switched together. As will be appreciated, any number of different combinations of clock frequencies and device groupings may be used. In this manner, an integrated circuit design may be provided that can be configured to achieve a wide range of different output fall times and/or rise times. In some implementations, programmable fuses (or other types of non-volatile memory) may be provided to set a desired "select" code word for a device. In this manner, a manufacturer or an end user may program an output driver circuit to achieve corresponding fall time and/or rise time characteristics for a particular application.

As described above, the output driver circuits and systems described herein may be used to provide an output signal for an integrated circuit. As will be appreciated, these output driver circuits and systems may be used with a wide variety of different integrated circuit types that perform many different applications. In some implementations, the output drivers may be implemented within integrated circuits that comprise sensor circuits for sensing physical properties in a surrounding environment such as, for example, position sensors, current sensors, speed sensors, proximity sensors, rotation sensors, and angle sensors. Such sensor circuits may take the form of a magnetic field sensor utilizing one or more magnetic field sensing elements, including but not limited to, a Hall effect element, a magnetoresistance element, or a magnetotransistor. In at least one embodiment, an integrated circuit is provided that includes a magnetic field sensor that includes both a Hall effect element and a magnetoresistance element. Many other applications also exist. In some embodiments, the techniques described herein may be used to provide an output signal for a linear integrated circuit.

Figure 8:
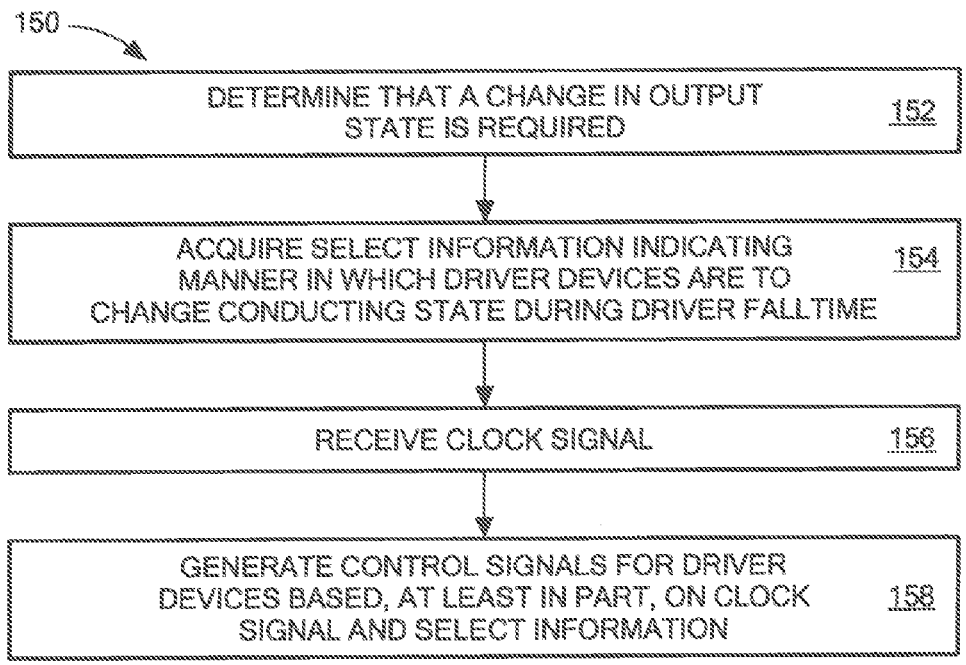
FIG. 8 is a flowchart illustrating an exemplary method for operating an integrated circuit having an output driver circuit with multiple parallel output driver devices in accordance with an embodiment.

FIG. 8 is a flowchart illustrating an exemplary method 150 for operating an integrated circuit having an output driver circuit with multiple parallel output driver devices in accordance with an embodiment. The method 150 may be used, for example, with the output driver circuits shown in FIGS. 2A, 2B, and 7. It may first be determined that the output state of an output driver circuit needs to be changed (block 152). Select information may then be acquired that indicates a manner in which the output driver devices of the output driver circuit are to change conducting state during a falling edge (or rising edge) of an output signal (block 154). A clock signal may also be acquired for use in providing timing for the switching of the output devices (block 156). Control signals are then generated for the output driver devices based, at least in part, on the clock signal and the select information (block 158).

The reason that the output state of the driver may need to be changed will typically depend upon the type of integrated circuit being used. For example, for an integrated circuit that includes a gear tooth sensor, a change in output state may be required to coincide with the detection of specific gear features by the sensor. For an integrated circuit that includes a proximity sensor, a change in output state may coincide with detection of a predetermined proximity between the sensor and a ferromagnetic article. Many other triggers may be used in other implementations.

The select information may be retrieved from, for example, a non-volatile memory (e.g., programmed fuses) of the integrated circuit. Alternatively, the select information may be received from another controller or a user. The select information may include, for example, information identifying groups of output devices that are to be switched together in a sequential fashion during a falling and/or rising edge of an output signal. Alternatively, or in addition, the select information may include information about a frequency at which the switching is to take place (e.g., a value for use in dividing a frequency of the clock signal for use in for use in generating the control signals). In at least one embodiment, a number of code words are defined to identify different ways to switch the output driver devices. The select information may then include one of the code words.

Figure 9:
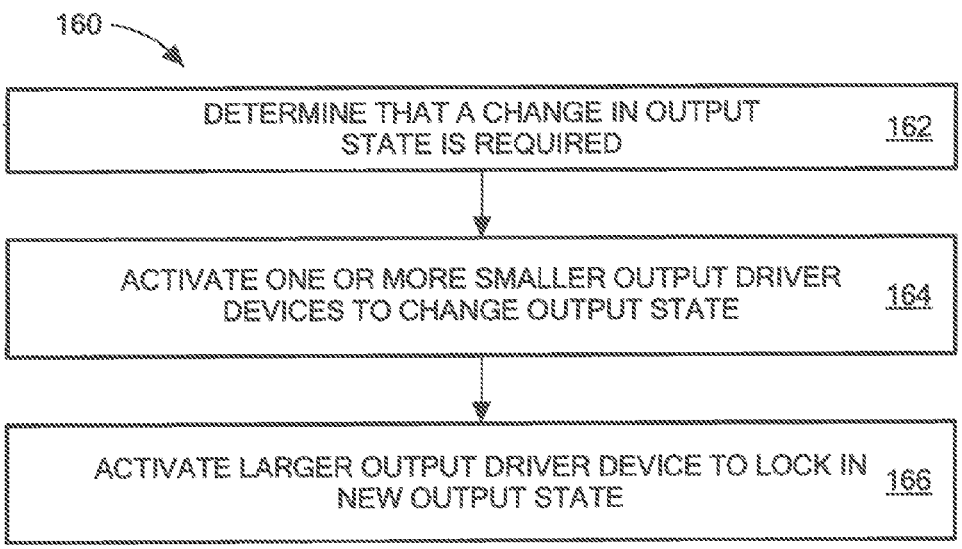
FIG. 9 is a flowchart illustrating an exemplary method for operating an integrated circuit having an output driver circuit using the parking brake approach in accordance with an embodiment.

FIG. 9 is a flowchart illustrating another exemplary method 160 for operating an integrated circuit having an output driver circuit with multiple parallel output driver devices in accordance with an embodiment. The method 160 may be used, for example, with an output driver circuit using a parking brake arrangement having one or more smaller output driver devices and a larger output driver device (e.g., driver circuit 120 of FIG. 6). It may first be determined that the output state of the output driver circuit needs to be changed (block 162). The smaller devices of the driver circuit may be activated (block 164). After the smaller devices have been activated, the larger output device is turned on to lock-in the output state of the output driver circuit so that it is less likely to undesirably change state in response to an EMI event or other noise event (block 164). In some implementations, multiple larger devices may be used. In some embodiments, when the smaller devices are activated, they may be driven into saturation (but this is not required).

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. An integrated circuit comprising:
an output driver circuit to generate an output signal for the integrated circuit, the output driver circuit comprising multiple driver devices connected in parallel, each of the multiple driver devices having a gate terminal, a drain terminal, and a source terminal, wherein the drain terminals of the multiple driver devices are coupled to a first node and the source terminals of the multiple driver devices are coupled to a second node; and
a controller to provide individual control signals to gate terminals of the multiple driver devices to control a state of the output signal, the controller having a change state input to receive an indication to change the state of the output signal and one or more select inputs responsive to a code word indicating a manner in which the multiple driver devices are to change conducting state when the state of the output signal is being changed;
wherein the controller is configured to change the conducting state of the multiple driver devices in sequence according to a first clock frequency in response to a first predetermined code word being present at the one or more select inputs and the controller is configured to change the conducting state of the multiple driver devices in sequence according to a second clock frequency in response to a second predetermined code word being present at the one or more select inputs, wherein the second predetermined code word is different from the first predetermined code word and the second clock frequency is different from the first clock frequency.

2. The integrated circuit of claim 1, wherein:
the controller is configured to change the conducting states of the multiple driver devices simultaneously in response to a predetermined code word being present at the one or more select inputs.

3. The integrated circuit of claim 1, wherein:
the controller is configured to change the conducting states of the multiple driver devices one by one in sequence in response to a predetermined code word being present at the one or more select inputs.

4. The integrated circuit of claim 1, wherein:
the controller is configured to change the conducting states of the multiple driver devices in sequence according to first predefined device groups in response to the first predetermined code word being present at the one or more select inputs.

5. The integrated circuit of claim 4, wherein:
the controller is configured to change the conducting states of the multiple driver devices in sequence according to second predefined device groups in response to the second predetermined code word being present at the one or more select inputs, wherein the second predefined device groups are different from the first predefined device groups.

6. The integrated circuit of claim 1, wherein:
the controller includes a clock input to receive a clock signal to provide a timing reference for changing the conducting states of the multiple driver devices.

7. The integrated circuit of claim 6, wherein:
the first clock frequency is the frequency of the input clock signal divided down by a first factor and the second clock frequency is the frequency of the input clock signal divided down by a second factor that is different from the first factor.

8. The integrated circuit of claim 1, wherein:
the controller is configured to change the conducting state of the multiple driver devices in sequence according first predefined device groups in response to either the first predetermined code word or the second predetermined code word being present at the one or more select inputs.

9. The integrated circuit of claim 1, further comprising:
a nonvolatile memory associated with the one or more select inputs of the controller for use in storing a programmed code word.

10. The integrated circuit of claim 1, wherein:
the multiple driver devices connected in parallel include multiple n-channel insulated gate field effect transistors (IGFETs).

11. The integrated circuit of claim 10, wherein:
the output driver circuit further comprises multiple p-channel IGFETs connected in parallel, wherein the multiple n-channel IGFETs and the multiple p-channel IGFETs are connected in a push-pull configuration, wherein the controller is configured to provide individual control signals to each of the multiple p-channel IGFETs and each of the multiple n-channel IGFETs to control the state of the output signal.

12. The integrated circuit of claim 1, further comprising:
sensor circuitry coupled to the controller for sensing a physical quantity in a surrounding environment.

13. The integrated circuit of claim 12, wherein the sensor circuitry comprises a magnetic field sensor.

14. The integrated circuit of claim 13, wherein:
the magnetic field sensor comprises at least one of a Hall effect element or a magnetoresistance element.

15. The integrated circuit of claim 13, wherein:
the magnetic field sensor comprises both a Hall effect element and a magnetoresistance element.

16. The integrated circuit of claim 1, further comprising:
an integrated circuit package carrying the integrated circuit.

17. An integrated circuit comprising:
an output driver circuit to generate an output signal for the integrated circuit, the output driver circuit comprising multiple driver devices connected in parallel, each of the multiple driver devices having a gate terminal, a drain terminal, and a source terminal, wherein the drain terminals of the multiple driver devices are coupled to a first node and the source terminals of the multiple driver devices are coupled to a second node; and
a controller to provide individual control signals to gate terminals of the multiple driver devices to control a state of the output signal, the controller being configured to change conducting states of the multiple driver devices in a sequential manner if a change in the state of the output signal is desired;
wherein the controller is configured to change the conducting states of the multiple driver devices in a sequential manner in accordance with a clock signal having a frequency that is set according to a code word stored in a non-volatile memory of the integrated circuit.

18. The integrated circuit of claim 17, wherein:
the controller is configured to change the conducting states of the multiple driver devices one by one in a sequential manner if a change in the state of the output signal is desired.

19. The integrated circuit of claim 17, wherein:
the controller is configured to change the conducting states of the multiple driver devices in a sequential manner according to predefined groups if a change in the state of the output signal is desired.

20. The integrated circuit of claim 17, wherein:
the controller is configured to change the conducting states of the multiple driver devices in a sequential manner in accordance with a first clock frequency if the code word stored in the non-volatile memory is a first predetermined codeword and the controller is configured to change the conducting states of the multiple driver devices in a sequential manner in accordance with a second clock frequency if the code word stored in the non-volatile memory is a second predetermined codeword, wherein the second predetermined codeword is different from the first predetermined codeword and the second clock frequency is different from the first clock frequency.

21. The integrated circuit of claim 20, wherein:
the controller includes a clock input to receive an input clock signal and the controller is configured to generate the clock signal having the first clock frequency by dividing down the input clock signal using a first factor if the code word stored in the non-volatile memory is the first predetermined codeword and the controller is configured to generate the clock signal having the second clock frequency by dividing down the input clock signal using a second factor if the code word stored in the non-volatile memory is the second predetermined codeword.

22. The integrated circuit of claim 17, further comprising:
an over-current sensor coupled between the second node and a ground terminal of the integrated circuit for use in detecting an over-current condition in the output driver circuit, wherein the controller is configured to change all driver devices in the output driver circuit to a non-conducting state if an over-current condition is sensed.

23. The integrated circuit of claim 17, further comprising:
sensor circuitry coupled to the controller for sensing a physical quantity in a surrounding environment.

24. The integrated circuit of claim 23, wherein the sensor circuitry comprises a magnetic field sensor.

25. The integrated circuit of claim 24, wherein:
the magnetic field sensor comprises at least one of a Hall effect element or a magnetoresistance element.

26. The integrated circuit of claim 24, wherein:
the magnetic field sensor comprises both a Hall effect element and a magnetoresistance element.

27. A machine implemented method for operating an output driver circuit within an integrated circuit, the output driver circuit having multiple output driver devices connected in parallel for use in generating an output signal, the method comprising:

determining that a change is needed in a state of the output signal;
acquiring select information indicating a manner in which the multiple output driver devices are to change conducting state to achieve the change in state of the output signal;
receiving a clock signal; and
generating individual control signals for the multiple output driver devices based, at least in part, on the clock signal and the select information;
wherein generating individual control signals for the multiple output driver devices includes:
  generating control signals that change the conducting states of the multiple driver devices in accordance with a first clock frequency if the select information includes a first code word, wherein the first clock frequency is related to a frequency of the clock signal; and
  generating control signals that change the conducting states of the multiple driver devices in accordance with a second clock frequency if the select information includes a second code word, wherein the second clock frequency is different from the first clock frequency and is related to the frequency of the clock signal.

28. The method of claim 27, wherein:
acquiring select information includes receiving the select information at one or more select inputs.

29. The method of claim 27, wherein:
acquiring select information includes reading the select information from a non-volatile memory.

30. The method of claim 27, wherein:
generating individual control signals for the multiple output driver devices includes generating control signals that change the conducting states of all of the multiple driver devices simultaneously if the select information includes a third code word.

31. The method of claim 27, wherein:
generating individual control signals for the multiple output driver devices includes generating control signals that change the conducting states of the multiple driver devices one by one in sequence if the select information includes a fourth code word.

32. The method of claim 27, wherein:
generating individual control signals for the multiple output driver devices includes generating control signals that change the conducting states of the multiple driver devices in sequence according to first predefined groups if the select information includes a third code word.

33. The method of claim 32, wherein:
generating individual control signals for the multiple output driver devices includes generating control signals that change the conducting states of the multiple driver devices in sequence according to second predefined groups if the select information includes a fourth code word, wherein the second predefined groups are different from the first predefined groups.

34. The method of claim 27, wherein:
the first clock frequency is equal to the frequency of the clock signal and the second clock frequency is equal to the frequency of the clock signal divided down by a factor associated with the second code word.

35. The method of claim 27, wherein:
generating individual control signals for the multiple output driver devices includes generating control signals that change the conducting states of the multiple driver devices in sequence according to first predefined groups if the select information includes either the first code word or the second code word.

36. The method of claim 27, wherein:
the integrated circuit includes sensor circuitry for sensing a physical quantity in a surrounding environment; and
determining that a change is needed in a state of the output signal includes receiving a change state indication from the sensor circuitry.

37. The method of claim 36, wherein:
the sensor circuitry comprises a magnetic field sensor.

38. The method of claim 37, wherein:
the magnetic field sensor comprises at least one of a Hall effect element or a magnetoresistance element.

39. The method of claim 38, wherein:
the magnetic field sensor comprises both a Hall effect element and a magnetoresistance element.

* * * * *

UNITED STATES PATENT AND TRADEMARK OFFICE
CERTIFICATE OF CORRECTION

| | | |
|---|---|---|
| PATENT NO. | : 8,957,715 B2 | Page 1 of 2 |
| APPLICATION NO. | : 13/653824 | |
| DATED | : February 17, 2015 | |
| INVENTOR(S) | : Jeff Eagen | |

It is certified that error appears in the above-identified patent and that said Letters Patent is hereby corrected as shown below:

In the Specification

Column 2, line 48 delete "an Integrated" and replace with --an integrated--.

Column 4, line 22 delete "circuit, hi" and replace with --circuit. In--.

Column 4, line 62 delete "in the state." and replace with --in the "on" state--.

Column 5, line 3 delete "semiconductor the" and replace with --semiconductor die--.

Column 5, line 9 delete "and grid arrays" and replace with --land grid arrays--.

Column 5, line 20 delete "In output" and replace with --in output--.

Column 6, line 37 delete "emissions, in" and replace with --emissions. In--.

Column 6, line 61 delete "fail times" and replace with --fall times--.

Column 8, line 4 delete "port 130" and replace with --port 136--.

Column 8, line 65 delete "DEVICE GROUPS" and replace with --<u>DEVICE GROUPS</u>--.

Column 9, line 8 delete "DEVICE GROUPS" and replace with --<u>DEVICE GROUPS</u>--.

Column 9, line 11 delete "DEVICE GROUPS" and replace with --<u>DEVICE GROUPS</u>--.

Column 9, line 39 delete "failing" and replace with --falling--.

Column 9, line 41 delete "fail" and replace with --fall--.

In the Claims

Column 13, line 21 delete "according first" and replace with --according to first--.

Signed and Sealed this
Fifteenth Day of March, 2016

Michelle K. Lee
*Director of the United States Patent and Trademark Office*

CERTIFICATE OF CORRECTION (continued)
U.S. Pat. No. 8,957,715 B2

Column 14, line 24 delete "codeword" and replace with --code word--.

Column 14, line 28-29 delete "code-word" and replace with --code word--.

Column 14, line 29 delete "codeword" and replace with --code word--.

Column 14, line 30 delete "codeword" and replace with --code word--.

Column 14, line 39 delete "codeword" and replace with --code word--.

Column 14, line 43-44 delete "code-word" and replace with --code word--.